US006992792B2

(12) United States Patent
Blumer

(10) Patent No.: US 6,992,792 B2
(45) Date of Patent: Jan. 31, 2006

(54) DIGITAL PULSE WIDTH MODULATOR FOR USE IN ELECTROSTATIC PRINTING MECHANISMS

(75) Inventor: Marc Blumer, Belmont, CA (US)

(73) Assignee: Electronics for Imaging, Inc., Foster City, CA (US)

( * ) Notice: Subject to any disclaimer, the term of this patent is extended or adjusted under 35 U.S.C. 154(b) by 860 days.

(21) Appl. No.: 09/895,043

(22) Filed: Jun. 29, 2001

(65) Prior Publication Data

US 2003/0007162 A1 Jan. 9, 2003

(51) Int. Cl.
*G06F 15/00* (2006.01)
*G06K 1/00* (2006.01)

(52) U.S. Cl. ....................... 358/1.2; 341/100; 341/101; 332/109

(58) Field of Classification Search ................. 358/1.2; 341/100, 101; 332/109
See application file for complete search history.

(56) References Cited

U.S. PATENT DOCUMENTS 5,379,126 A 1/1995 Seto et al.
5,798,720 A * 8/1998 Yano .......................... 341/101
6,166,821 A 12/2000 Blumer
6,188,339 B1 2/2001 Hasegawa

FOREIGN PATENT DOCUMENTS

JP 02 210964 11/1990

* cited by examiner

*Primary Examiner*—Edward Coles
*Assistant Examiner*—Yixing Qin

(57) ABSTRACT

A fully digital pulse width modulator substantially doubles resolution in a laser printer by outputting data to the laser on both the rising and falling edges of the clock cycle. A counter and the clock itself are used to select input to a multiplexer, and consequently, the data output to the laser from the multiplexer. A data selector code, generated by concatenating the binary value of the counter and the inverted clock bitwise, selects which of the 16 bits representing a pixel to place onto the data line, so that all 16 bits are output to the laser serially and sequentially in eight clock cycles. By using both the rising and falling edges of a clock cycle, the clock speed of the device is effectively doubled, without increasing actual clock speed. Device resolution is improved simply and inexpensively without major modification of printed circuit boards.

18 Claims, 3 Drawing Sheets

DIGITAL PULSE WIDTH MODULATOR FOR USE IN ELECTROSTATIC PRINTING MECHANISMS

BACKGROUND OF THE INVENTION

1. Technical Field

The invention generally relates to image forming apparatuses such as laser printers. More particularly, the invention relates to a system and method for increasing resolution of a laser printer through the use of a digital pulse width modulator that clocks digital data specifying grayscale values of pixels to be printed to the laser on both the ascending and descending edges of the clock, effectively doubling the clock rate and thereby increasing the resolution of the printer.

2. Technical Background

A typical laser printer usually includes an electrostatic printing mechanism composed of a cylindrical drum having an electrically charged surface. Toner particles of opposite charge adhere to the drum. The image to be printed is formed on the drum by means of a laser beam directed toward the drum. Wherever the laser impinges on the drum, the drum surface is discharged, creating an area in which the charged toner particles will not adhere, corresponding to white areas in the image. Solid areas are represented by the charged areas of the drum, where the toner particles adhere. The laser, driven by a bitmap image signal composed of binary data, scans the drum line by line, emitting pulses that correspond to the white and black areas of the image. Subsequently, the image is printed to paper by transferring the toner on the drum surface to paper by means of a heating process. The laser has only two states, on and off, and, thus, is capable of rendering only black and white areas. This arrangement is well suited to printing of text, where the characters have sharp edges and the image typically only includes black text and white space. However, images, such as photographs, have fuzzy edges and gradations in tone. Producing a quality print of such an image requires that the printer be able to produce intermediate tones, or grayscale values. Generally, grayscale values are produced using halftones, in which different values are represented by dots of varying size spaced at varying intervals. Thus, for a laser printer to print halftones, the output of the laser must be modulated, enabling it to produce the variably sized and spaced dots that make up a halftone image.

A common way of driving the laser such that it can reproduce intermediate tones is to provide a pulse width modulator. Digital data specifying grayscale values of the pixels to be printed is supplied to the pulse width modulator, and the pulse width modulator outputs a signal that varies the width, and also the period of the laser pulses, producing variably sized and spaced dots. The prior art provides several examples of laser printers that include pulse width modulators: for example: S. Haneda, Y. Itahara, T. Hasabe, T. Niitsuma, Image forming apparatus with sub-pixel position control, U.S. Pat. No. 5,432,611 (Jul. 11, 1995), or T. Motoi, S. Haneda, Image forming method, U.S. Pat. No. 5,436,644 (Jul. 25, 1995), or Y. Itihara, S. Haneda, N. Koizumi, T. Hasabe, T. Niitsuma, Image forming apparatus with neighboring pixel control, U.S. Pat. No. 5,467,422 (Nov. 14, 1995), or S. Haneda, Y. Itihara, T. Hasabe, T. Niitsuma, Color image forming apparatus with density control, U.S. Pat. No. 5,473,440 (Dec. 5, 1995), or N. Koizumi, S. Haneda, Y. Ichihara, T. Hasabe, T. Niitsuma, Digital image forming apparatus using subdivided pixels, U.S. Pat. No. 5,486,927 (Jan. 23, 1996), or S. Haneda, Y. Ichihara, T. Hasabe, T. Niitsuma, Image forming apparatus that modulates image density data, U.S. Pat. No. 5,493,411 (Feb. 20, 1996) or S. Haneda, M. Fukuchi, T. Miwa, Image forming apparatus with edge point detector based on image density charge, U.S. Pat. No. 5,619,242 (Apr. 8, 1997). All of the previous examples describe an analog pulse width modulator circuit that includes a digital-to-analog convertor (DAC) and a comparator. The binary image data is converted to an analog signal. The image signal is compared with a reference signal to derive a pulse width-modulating signal. Such analog pulse width modulators, however, suffer several disadvantages. Due to their analog nature, they are inherently sensitive to noise and they are vulnerable to voltage drifts and temperature drifts, requiring frequent recalibration. Furthermore, they are implemented using discrete components, rendering them complicated and expensive. Thus, it would be desirable to provide a purely digital means of pulse width modulation that eliminated the disadvantages of the analog circuit.

Digital pulse width modulators are known in the art. Typically, these pulse width modulators include a pixel clock and a shift register. Each pixel of the image is represented by 8 bits. The 8 bits representing a pixel are loaded into the shift register in parallel. Subsequently, at the rising edge of each clock cycle, the data in the register is shifted by one value. Thus, one new value is output to the laser with every clock cycle. When all 8 bits have been output, the register is reset and reloaded with the data for another pixel. A deficiency of this type of arrangement is that the clock speed imposes an upper limit on the granularity, or resolution that can be achieved, thus limiting the image quality. J. Hewes, Method of increasing the grayscale resolution of a non-impact LED page printer, U.S. Pat. No. 5,105,202 (Apr. 14, 1992) describes such a system and suggests that resolution can be improved by increasing the data output of the shift register. However, no means for increasing the shift register's output is suggested. The practical maximum frequency for a pixel clock on a printed circuit board is approximately 100 mHz. Thus, in clocking data from the shift register only on the rising edge of the clock cycle, the maximum output of the shift register is approximately one new value every 10 ns, imposing an upper limit on the achievable resolution. Increasing the clock speed to achieve a greater output is not a practical or feasible solution.

Accordingly, it would be a significant technological advance to provide a simple, inexpensive way of increasing the output of a digital pulse width modulator in a laser printer, so that greater resolution is achieved, thereby providing a better quality output image. It would be highly advantageous to achieve such an improvement in resolution without resort to changing the clock speed.

SUMMARY OF THE INVENTION

The invention provides a fully digital pulse width modulator in an electrostatic printing mechanism of a laser printer that outputs data to the laser on both the rising and falling edges of the clock cycle. Thus, the clock rate is effectively doubled, consequently doubling resolution of the laser printer. The digital pulse width modulator of the current invention includes a multiplexer and a counter in combination with the clock itself to select input to the multiplexer and, consequently, the data output to the laser from the multiplexer. In a preferred embodiment of the invention, each pixel is specified by a 16-bit value. The 16 bits are applied to the data inputs of a 16:1 multiplexer. The counter increments one for each clock cycle, up to eight clock cycles. The binary value of the counter is concatenated bitwise with the binary value of the inverted clock to generate a 4-bit data selector code that is input to the multiplexer. The data from the data input corresponding to the data selector code is input to the multiplexer and subsequently output to the laser. In this way, the 16 bits representing each pixel of the image are output serially and sequentially to the laser, in only eight clock cycles. Because the invention makes use of both the rising and falling edges of a clock cycle, the clock speed of the device is effectively doubled, without increasing the actual clock speed. By using 16 bits to represent each pixel, the resolution of the device is also effectively doubled. The invention provides a simple, inexpensive way to improve the resolution of a laser printer, without resort to major modification of printed circuit boards.

DETAILED DESCRIPTION

Figure 1:
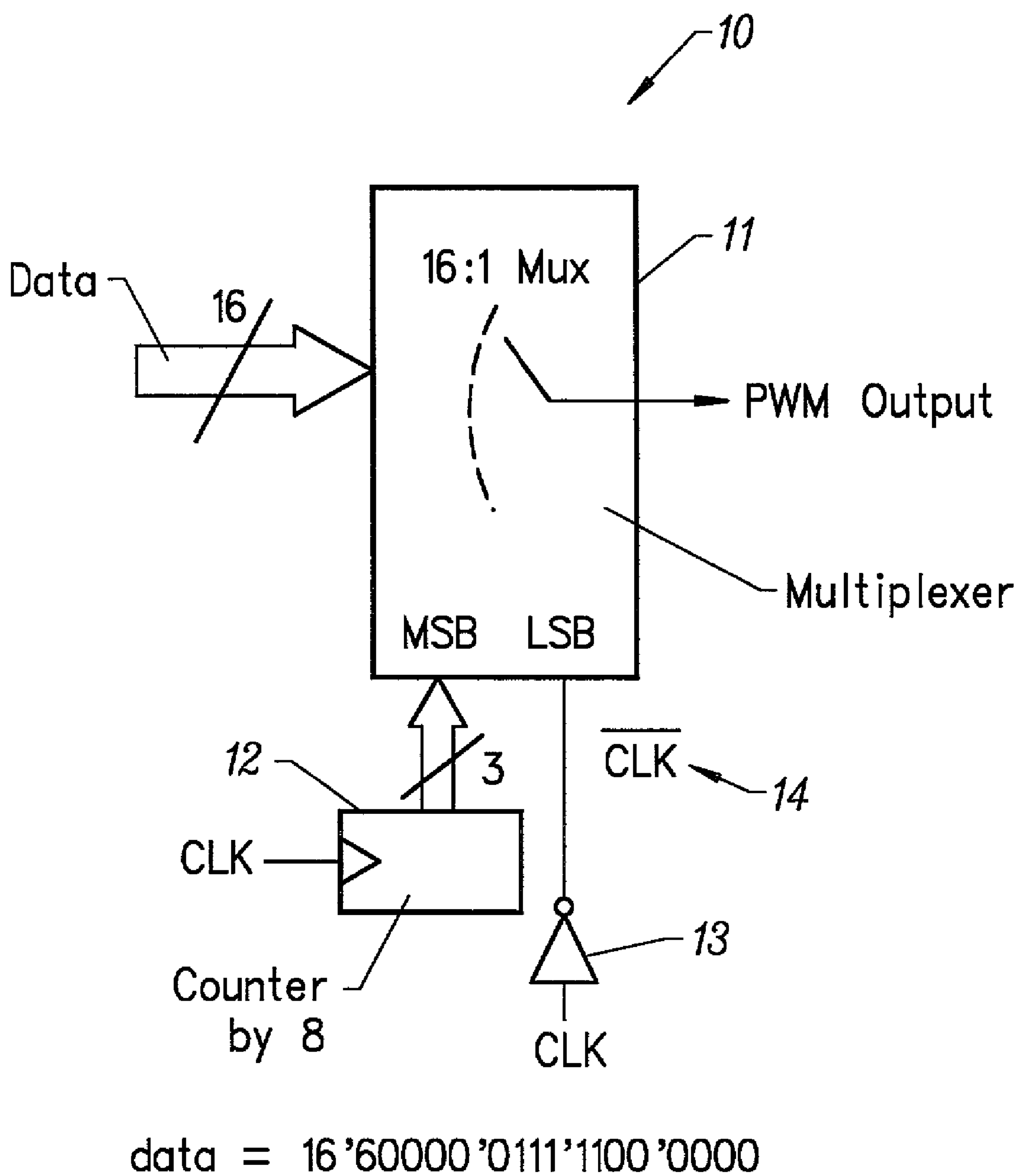
FIG. 1 provides a schematic diagram of a digital pulse width modulator for use in electrostatic printing mechanisms according to the invention.

Turning first to FIG. 1, a system 10 for producing a variable width pulse in an electrostatic printing mechanism is shown. Digital information supplied to an electrostatic printing mechanism of, for example, a laser printer specifies grayscale intensity of pixels to be printed. However, the digital information must be converted to a format appropriate for directly driving the laser, or other light-emitting element. Unlike the digital is pulse width modulators (PWM) conventionally used with electrostatic printing devices, which output one bit on the rising edge of each pulse of a timing device such as a pixel clock, the invention outputs one bit on each of the rising and falling edges of the clock pulse, effectively doubling the throughput of the PWM. Thus, while using the same clock as a conventional PWM, the invention is able to specify each pixel by a 16-bit value, providing much finer resolution, because the 16-bit value can specify more than sixty-five thousand discrete values, as opposed to the 256 discrete values that can be expressed by an 8-bit value. Prioir to use by the electrostatic printing mechanism, the 16-bit pixel intensity values are converted to pulse widths corresponding to the grayscale intensity of the pixel to be printed.

The pulse width modulator 10 includes a data-selecting element 11. According to a preferred embodiment of the invention, the data-selecting element is a 16:1 multiplexer. That is, a multiplexer having sixteen data inputs and one output. A counter 12 is incremented by one for every clock signal received. Additionally, the clock signal is applied to an inverter 13 to produce an inverted clock signal 14. As described below, the value of the counter and the inverted clock are concatenated to generate a 4-bit data selector code, which is subsequently input to the multiplexer 11. Based on the data selector code, one of the inputs 21 (FIG. 2) to the multiplexer is selected and the bit value at the selected input is placed on the data line. Subsequently, the selected value is output to the light-emitting element of the electrostatic printing mechanism (not shown).

Figure 2:
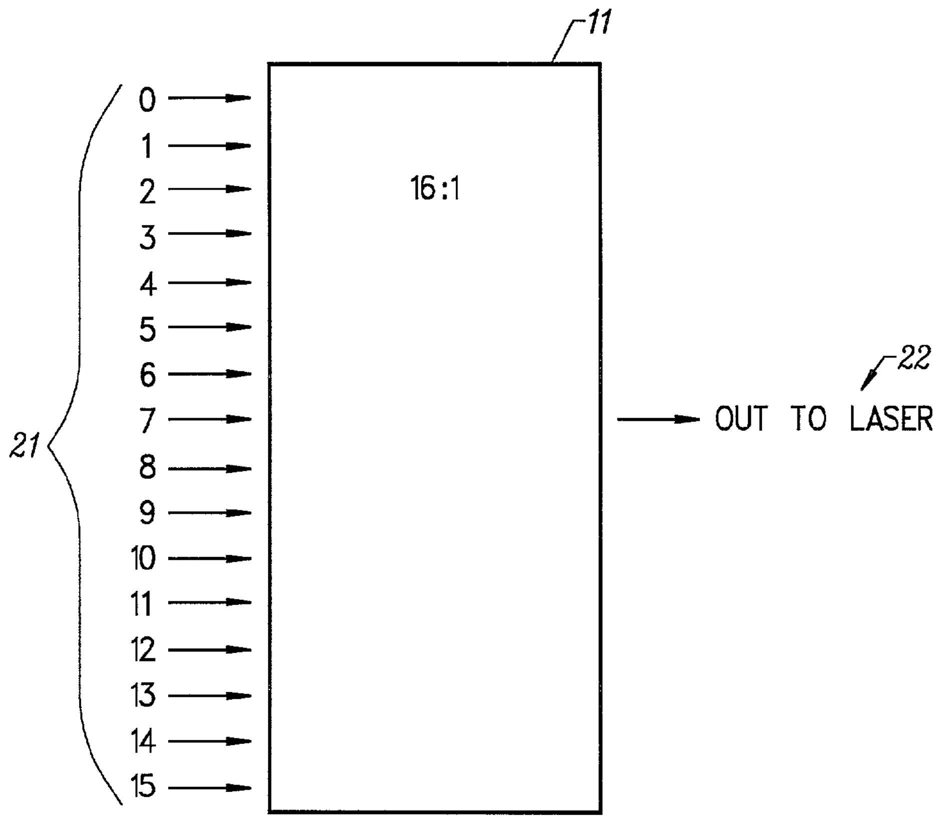
FIG. 2 shows a 16:1 multiplexer from the pulse width modulator of FIG. 1 according to the invention.

As FIG. 2 shows, the multiplexer 11, has sixteen data inputs 21 designated 0–15, one for each bit of the 16-bit value specifying the pixel to be printed. As FIG. 1 shows, the counter 12 is reset after every eight clock cycles. The digital PWM may b e implemented by creating a circuit from discrete hardware components. However, the preferred method of implementing the invention is with a programmable element, such as a programmable logic device (PLD). The PLD is programmed using conventional methods in a hardware description language such as VERILOG or VHDL.

As previously described, the data inputs to the multiplexer are selected, in a serial and sequential fashion, by inputting a data selector code to the multiplexer. As each clock pulse is emitted, the counter increments one for each pulse, resetting every eight clock cycles. Thus, using the binary value of the counter as a selector code yields eight distinct 3-bit codes: 000, 001, 010, 011, 100, 101, 110, and 111. However, the sixteen inputs of the multiplexer require sixteen distinct selector codes, necessitating 4-bit values for the selector codes. Advantageously, as shown in Table 1 below, the invention uses the value of the inverted clock signal to provide an additional bit to generate 4-bit data selector codes. The binary value of the counter is concatenated in bitwise fashion with the value, 0 or 1, of the inverted counter to create a 4-bit value, creating sixteen distinct selector codes. As shown, the counter value provides the three most significant bits of the selector code, and the inverted clock provides the least significant bit. In this way, a data selector code is generated at the rising edge of the clock, when the inverted clock is at 0 and at the falling edge of the clock, when the inverted clock goes to 1. Thus, for each clock cycle, two bits are selected and placed on the data line for output to the light-emitting element.

TABLE 1

Data Selector Codes Generated From Counter and Inverse Clock

| Counter | Counter Binary Value | Inverted Clock | Data Selector Code | Data Input |
|---|---|---|---|---|
| 0 | 000 | 0 | 0000 | 0 |
| 0 | 000 | 1 | 0001 | 1 |
| 1 | 001 | 0 | 0010 | 2 |
| 1 | 001 | 1 | 0011 | 3 |
| 2 | 010 | 0 | 0100 | 4 |
| 2 | 010 | 1 | 0101 | 5 |
| 3 | 011 | 0 | 0110 | 6 |
| 3 | 011 | 1 | 0111 | 7 |
| 4 | 100 | 0 | 1000 | 8 |
| 4 | 100 | 1 | 1001 | 9 |
| 5 | 101 | 0 | 1010 | 10 |
| 5 | 101 | 1 | 1011 | 11 |
| 6 | 110 | 0 | 1100 | 12 |
| 6 | 110 | 1 | 1101 | 13 |
| 7 | 111 | 0 | 1110 | 14 |
| 7 | 111 | 1 | 1111 | 15 |

Figure 3:
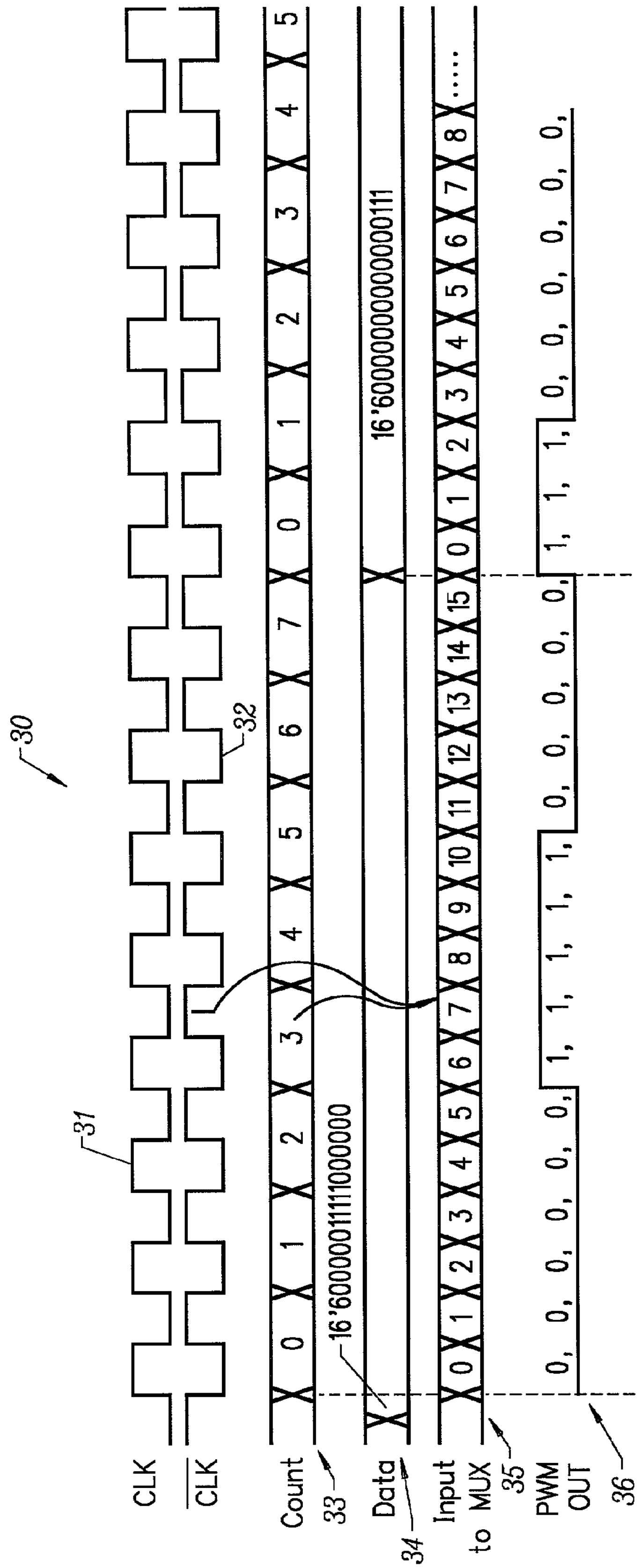
FIG. 3 provides a timing diagram illustrating operation of the digital pulse width modulator according to the invention.

Referring now to FIG. 3, a timing diagram 30 showing the operation of the digital PWM is provided. The clock signal 31 and the inverted clock signal 32 are shown. Conventionally, the low and high levels are designated 0 and 1, respectively. The counter signal 33 is shown, incrementing one for every clock cycle and resetting after eight clock cycles. As shown, a 16-bit value 34 is applied to the multiplexer, and data selector codes specify a data input. In the example shown, count 3, having a binary value of 011 is concatenated with the inverted clock 1 to generate a data selector code 0111. The data selector code 0111, specifying data input 7 is input to the multiplexer 35. Whereupon the value at data input 7 is placed on the data line. As shown, the value at data input 7 is '1.' Thus, '1' is ultimately output 36 from the PWM to the light-emitting element of the electrostatic printing device. As shown in the timing diagram, the counter is reset after eight clock cycles, and a new 16-bit value applied to the data inputs of the multiplexer.

Generation of the data selector codes by concatenating the counter value and the inverted clock is accomplished using conventional methods known to those skilled in the art of digital logic programming. The digital pulse width modulator of the current invention is readily integrated with conventional circuitry for electrostatic printing devices in a manner easily discernible to those skilled in the design of printed circuit boards. While the invention has been described herein with reference to a laser printer, it also finds application in any image-forming device utilizing an electrostatic printing mechanism, an LED printer, for example. While the invention has been described with respect to modulation of pulse width, it will be appreciated by those skilled in the art that intervals between pulses may also be modulated, thereby specifying position of the dot within the pixel to be printed.

Although the invention has been described herein with reference to certain preferred embodiments, one skilled in the art will readily appreciate that other applications may b e substituted for those set forth herein without departing from the spirit and scope of the present invention. Accordingly, the invention should only be limited by the claims included below.

What is claimed is:

1. A method of increasing resolution of an image-forming device, the method comprising:

applying a sixteen-bit signal representing at least a portion of a source image to a multiplexer having sixteen data inputs, so that each bit of the sixteen bit signal corresponds to an input to the multiplexer;

at each of a rising and falling edge of a clock pulse, selecting a data input by:

incrementing a counter for each clock cycle;

at each clock cycle, concatenating a binary value of the counter with a value of an inverted clock signal in bitwise fashion to form a data selector code;

inputting the data selector code to the multiplexer; and selecting a data input corresponding to the data selector code, wherein each input is serially and sequentially selected;

inputting a data bit corresponding to the selected data input to the multiplexer; and transmitting the data bit to a light-emitting element, so that 2 bits are output to the light-emitting element for each clock cycle;

wherein the output specifies any of a width of or an interval between light pulses emitted by said light-emitting element.

2. The method of claim 1, wherein the binary value of the counter comprises the three most significant bits of the data selector code and the value of the inverted clock signal comprises the least significant bit.

3. The method of claim 1, wherein the value of the inverted clock signal is either 0 or 1, 0 corresponding to a low level and 1 corresponding to a high level.

4. The method of claim 1, wherein sixteen 4-bit data selector codes are generated.

5. The method of claim 1, wherein said step of selecting a data input further comprises: resetting the counter after every eight clock cycles.

6. The method of claim 1, wherein the image-forming device comprises a laser printer and wherein the light-emitting device comprises a laser.

7. The method of claim 1, wherein the portion of the source image comprises a pixel, and wherein a pixel is specified by a 16-bit value.

8. The method of claim 1, said method implemented in a circuit comprising discrete components.

9. The method of claim 1, said method implemented in a programmable logic device (PLD).

10. A system for increasing resolution of an image-forming device, the system comprising:

a multiplexer having sixteen data inputs and at least one output, each input corresponding to one bit of a sixteen bit signal applied to the multiplexer, the signal representing at least a portion of a source image;

a clock signal; and means for selecting a data input at each of a rising and falling edge of the clock signal, the means for selecting comprising:

a counter, wherein the counter is incremented for each clock cycle; and a data selector code comprising the binary value of the counter concatenated with a value of an inverted clock signal in bitwise fashion;

wherein the data selector code is input to the multiplexer, and the data input corresponding to the data selector code is selected, wherein each input is selected in serial and sequential fashion; and wherein each of the inputs is selected and the corresponding bit input to the multiplexer so that 2 bits are output to a light-emitting element of the image-forming device for each clock cycle, the output specifying any of a width of or interval between pulses emitted by said light-emitting element.

11. The system of claim 10, wherein the binary value of the counter comprises the three most significant bits of the data selector code and the value of the inverted clock signal comprises the least significant bit.

12. The system of claim 11, wherein the value of the inverted clock signal is either 0 or 1, 0 corresponding to a low level and 1 corresponding to a high level.

13. The system of claim 10, wherein sixteen 4-bit data selector codes are generated.

14. The system of claim 10, wherein the counter is reset after every eight clock cycles.

15. The system of claim 10, wherein the image-forming device comprises a laser printer and wherein the light-emitting device comprises a laser.

16. The system of claim 10, wherein the portion of the source image comprises a pixel, and wherein 16 bits represent a pixel.

17. The system of claim 10, the system comprising a circuit composed of discrete components.

18. The system of claim 10, the system comprising a programmable logic device (PLD).

* * * * *